(12) United States Patent
Huang et al.

(10) Patent No.: US 12,362,223 B2
(45) Date of Patent: Jul. 15, 2025

(54) SEMICONDUCTOR STRUCTURE, FABRICATION METHOD AND THREE-DIMENSIONAL MEMORY

(71) Applicant: YANGTZE MEMORY TECHNOLOGIES CO., LTD., Wuhan (CN)

(72) Inventors: Teng Huang, Wuhan (CN); Ziqun Hua, Wuhan (CN); Yanwei Shi, Wuhan (CN); Lan Yao, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 395 days.

(21) Appl. No.: 17/857,965

(22) Filed: Jul. 5, 2022

(65) Prior Publication Data
US 2023/0067454 A1    Mar. 2, 2023

Related U.S. Application Data

(63) Continuation of application No. PCT/CN2021/115613, filed on Aug. 31, 2021.

(51) Int. Cl.
| | |
|---|---|
| *H01L 21/762* | (2006.01) |
| *H01L 21/306* | (2006.01) |
| *H01L 21/311* | (2006.01) |
| *H01L 21/768* | (2006.01) |
| *H10B 41/40* | (2023.01) |
| *H10B 43/40* | (2023.01) |
| *H10D 84/01* | (2025.01) |
| *H10D 84/03* | (2025.01) |

(52) U.S. Cl.
CPC .. *H01L 21/76224* (2013.01); *H01L 21/30604* (2013.01); *H01L 21/31144* (2013.01); *H01L 21/76859* (2013.01); *H10B 41/40* (2023.02); *H10B 43/40* (2023.02); *H10D 84/0188* (2025.01); *H10D 84/038* (2025.01)

(58) Field of Classification Search
CPC ......... H01L 21/76224; H01L 21/30604; H01L 21/31144; H01L 21/823878; H01L 21/76229; H10D 84/0188
See application file for complete search history.

(56) References Cited

U.S. PATENT DOCUMENTS

| | | | | |
|---|---|---|---|---|
| 7,268,028 B1 * | 9/2007 | Furukawa | ....... | H01L 21/823892 257/E21.546 |
| 9,806,150 B2 * | 10/2017 | Hsiao | ................ | H01L 29/66659 |

(Continued)

FOREIGN PATENT DOCUMENTS

| | | |
|---|---|---|
| CN | 101286480 A | 10/2008 |
| TW | 466685 B | 12/2001 |

*Primary Examiner* — Bac H Au
(74) *Attorney, Agent, or Firm* — BAYES PLLC

(57) ABSTRACT

A semiconductor structure, fabrication method and three-dimensional memory are disclosed. A method of fabricating a semiconductor structure includes providing a substrate including a first device region and a second device region; forming a plurality of first recesses in the first device region and a second recess in the second device region, the first recesses and the second recess being formed simultaneously; forming a first isolation trench in the first device region; and forming a second isolation trench in the second device region at a position of the second recess.

18 Claims, 8 Drawing Sheets

(56) References Cited

U.S. PATENT DOCUMENTS

| | | | | |
|---|---|---|---|---|
| 2007/0241373 A1* | 10/2007 | Kuroi | ............... | H01L 21/763 |
| | | | | 257/E21.627 |
| 2009/0159966 A1 | 6/2009 | Huang | | |
| 2014/0024186 A1* | 1/2014 | Yoo | ............... | H01L 21/823462 |
| | | | | 257/E21.409 |
| 2014/0051222 A1* | 2/2014 | Terahara | ............... | H01L 21/823892 |
| | | | | 438/296 |
| 2023/0063917 A1* | 3/2023 | Hou | ............... | H01L 21/76229 |
| 2023/0068185 A1* | 3/2023 | Huang | ............... | H10B 43/40 |
| 2023/0069612 A1* | 3/2023 | Hou | ............... | H01L 21/76229 |

\* cited by examiner

SEMICONDUCTOR STRUCTURE, FABRICATION METHOD AND THREE-DIMENSIONAL MEMORY

CROSS-REFERENCE TO RELATED APPLICATIONS

This application is a continuation of International Application No. PCT/CN2021/115613, filed on Aug. 31, 2021, which is incorporated herein by reference in its entirety.

BACKGROUND

The present application relates to the field of semiconductor technology, and more particularly to a semiconductor structure, fabrication method and three-dimensional (3D) memory.

3D memories (e.g., 3D NAND Flashes) are widely used in computers, solid-state drives and electronic devices due to their advantages such as high memory density, high programming speed etc. To meet the market demands of increasing memory capacity without increasing the memory footprint, 3D memories need to have increased memory density and reduced dimensions.

The peripheral circuitry of a 3D memory includes devices having various operating voltages, such as high voltage (HV) devices and low voltage (LV) devices. PMOS devices, NMOS devices and shallow trench isolations (STIs) exist in both the HV devices and the LV devices. The STIs are used to isolate adjacent devices from each other. However, since operating voltages of HV devices are higher than those of LV devices, different processes are required to form STIs in different regions for better isolation effects, which complicates the process flow and increases the fabrication cost.

SUMMARY

In one aspect, a method of fabricating a semiconductor structure is provided. A substrate including a first device region and a second device region is provided. A plurality of first recesses are formed in the first device region and a second recess is formed in the second device region, the first recesses and the second recess being formed simultaneously. A first isolation trench is formed in the first device region to separate adjacent the plurality of first recesses. A second isolation trench is formed in the second device region at a position of the second recess.

In some implementations, the first isolation trench and the second isolation trench are formed simultaneously.

In some implementations, an ion doping is performed on the first device region and the second device region.

In some implementations, a first dielectric layer is formed in the first device region, the first dielectric layer being at least partially over inner walls of the first recesses. A first gate is formed on the first dielectric layer, and a source and a drain are formed on both sides of the first gate respectively.

In some implementations, a plurality of third recesses are formed in the second device region while forming the second recess, and the second recess is located between adjacent the plurality of third recesses.

In some implementations, a first dielectric layer and a second dielectric layer are formed in the first device region and the second device region respectively, the first dielectric layer is at least partially over inner walls of the first recesses, the second dielectric layer is at least partially over inner walls of the third recesses, and a thickness of the first dielectric layer is less than that of the second dielectric layer.

A first gate and a second gate are formed on the first dielectric layer and the second dielectric layer respectively, and a source and a drain are formed on both sides of each of the first gate and the second gate respectively.

In some implementations, a dielectric material is filled into the first isolation trench and the second isolation trench respectively to form a first isolation structure and a second isolation structure.

In a further aspect, a method of fabricating a semiconductor structure is provided. A first active area is formed in a first device region of a substrate and a second active area is formed in a second device region of the substrate. A first removal operation is performed to form a first recess in the first device region in the first active area and a second recess in the second device region outside the second active area. A second removal operation is performed to form a first isolation trench in the first device region adjacent to the first active area and depth the second recess to form a second isolation trench in the second device region outside the second active area.

In some implementations, a first isolation structure is formed in the first isolation trench and a second isolation structure is formed in the second isolation trench. A height of the first isolation structure is less than a height of the second isolation structure.

In some implementations, a depth of the first isolation trench is less than a depth of the second isolation trench.

In some implementations, a first dielectric layer is formed in the first recess. A first gate is formed on the first dielectric layer. A top surface of the first dielectric layer is at least partially below a top surface of the first device region.

In some implementations, a second dielectric layer is formed on the second active area. A second gate is formed on the second dielectric layer. The top surface of the first dielectric layer is at least partially below a top surface of the second dielectric layer.

In some implementations, a third recess is formed in the second device region in the second active area.

In some implementations, a first dielectric layer is formed in the first recess and a second dielectric layer in the third recess. A first gate is formed on the first dielectric layer and a second gate is formed on the second dielectric layer. A top surface of the first dielectric layer is at least partially below a top surface of the first device region, and a top surface of the second dielectric layer is at least partially below a top surface of the second device region.

In some implementations, a depth of the second isolation trench is equal to a sum of a depth of the first isolation trench and a depth of the first recess.

In still a further aspect, a semiconductor structure is disclosed. The semiconductor structure includes a substrate including a first device region and a second device region; a plurality of first transistors disposed in the first device region and a first isolation structure located between adjacent the plurality of first transistors, each of the plurality of first transistors having a first gate at least partially located in a first recess; and a plurality of second transistors disposed in the second device region and a second isolation structure located between adjacent the plurality of second transistors, a depth of the second isolation structure being larger than a depth of the first isolation structure.

In some implementations, the depth of the second isolation structure is a sum of the depth of the first isolation structure and a depth of the first recess.

In some implementations, each of the plurality of first transistors includes a first dielectric layer at least partially located in the first recess, and a first gate on the first dielectric layer, each of the plurality of second transistors includes a second dielectric layer at least partially located in a third recess, and a second gate at least partially in the third recess, and a thickness of the first dielectric layer is less than a thickness of the second dielectric layer.

In some implementations, the substrate further includes a first active area in the first device region and a second active area in the second device region, and the first recess is located in the first active area.

In some implementations, the first isolation structure is located in the first device region outside the first active area, and the second isolation structure is located in the second device region outside the second active area.

BRIEF DESCRIPTION OF THE DRAWINGS

The accompanying drawings, which are incorporated herein and form a part of the specification, illustrate aspects of the present disclosure and, together with the description, further serve to explain the principles of the present disclosure and to enable a person skilled in the pertinent art to make and use the present disclosure.

DETAILED DESCRIPTION

Figure 1:
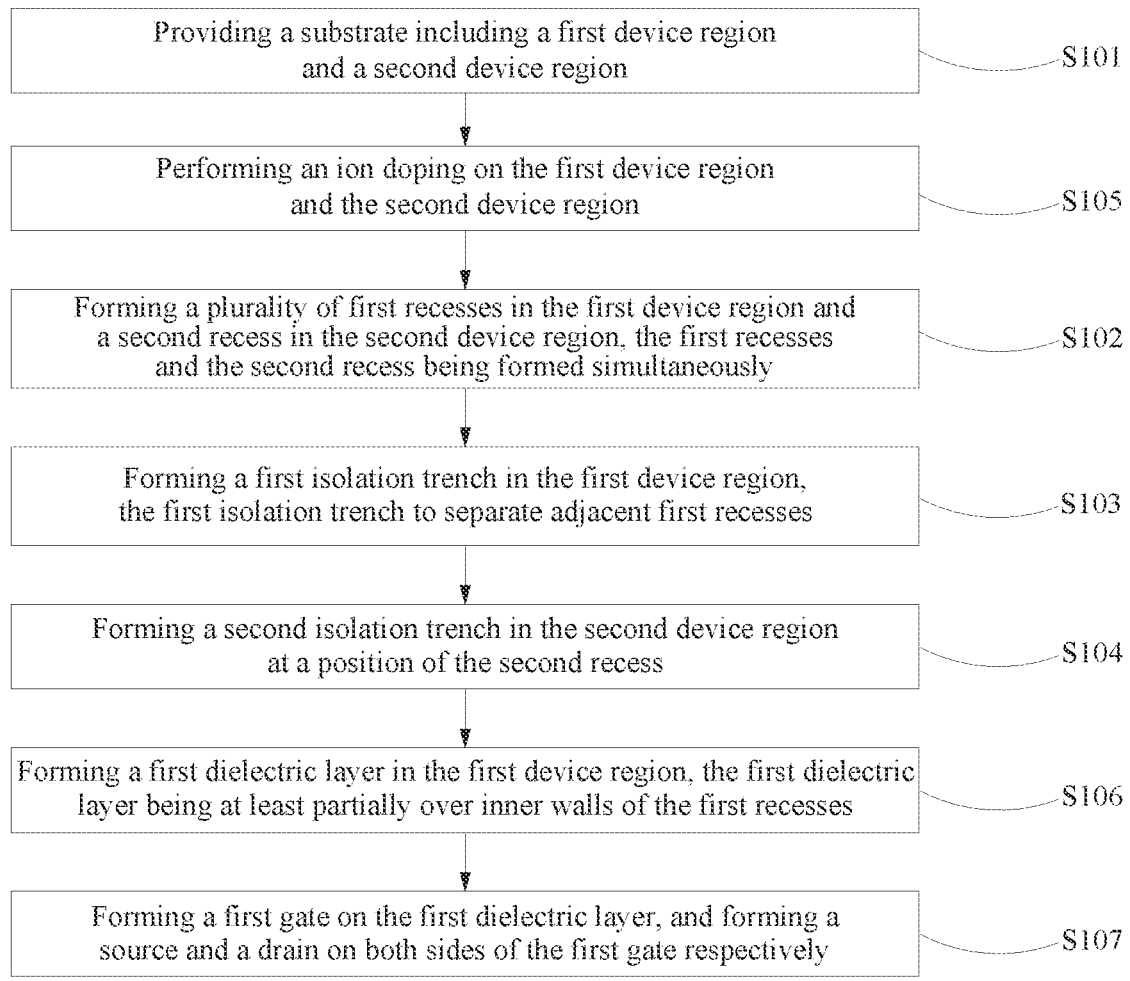
FIG. 1 illustrates a flowchart of a method of fabricating an exemplary semiconductor structure, according to some aspects of the present disclosure.

Although specific configurations and arrangements are discussed, it should be understood that this is done for illustrative purposes only. As such, other configurations and arrangements can be used without departing from the scope of the present disclosure. Also, the present disclosure can also be employed in a variety of other applications. Functional and structural features as described in the present disclosures can be combined, adjusted, and modified with one another and in ways not specifically depicted in the drawings, such that these combinations, adjustments, and modifications are within the scope of the present disclosure.

In general, terminology may be understood at least in part from usage in context. For example, the term "one or more" as used herein, depending at least in part upon context, may be used to describe any feature, structure, or characteristic in a singular sense or may be used to describe combinations of features, structures, or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations), and the spatially relative descriptors used herein may likewise be interpreted accordingly.

As used herein, the term "layer" refers to a material portion including a region with a thickness. A layer can extend over the entirety of an underlying or overlying structure or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layers thereupon, thereabove, and/or therebelow. A layer can include multiple layers. For example, an interconnect layer can include one or more conductors and contact layers (in which interconnect lines and/or vertical interconnect access (via) contacts are formed) and one or more dielectric layers.

As shown in FIG. 1, the present application provides a method of fabricating a semiconductor structure. The method may have a specific process flow that includes the following steps corresponding to the structural views in FIGS. 2 to 9.

In step S101, a substrate 210 is provided. The substrate 210 may include a first device region and a second device region. In some implementations, the method of fabricating a semiconductor structure, according to some aspects of the present disclosure, will be detailed in connection with FIGS. 2-9.

Figure 2:
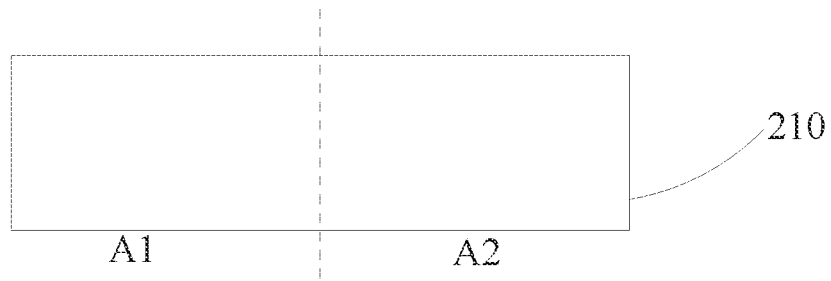
FIG. 2 illustrates a structural schematic diagram of an exemplary structure after providing a substrate, according to some aspects of the present disclosure.

As shown in FIG. 2, the structure formed in step S101 may include the substrate 210, which includes the first device region A1 and the second device region A2. In some implementations, the substrate 210 serves as the foundation to form semiconductor devices and may include semiconductor materials, such as silicon (Si), germanium (Ge), or silicon germanium (GeSi), silicon carbide (SiC) etc., or may include any other materials.

Figure 3:
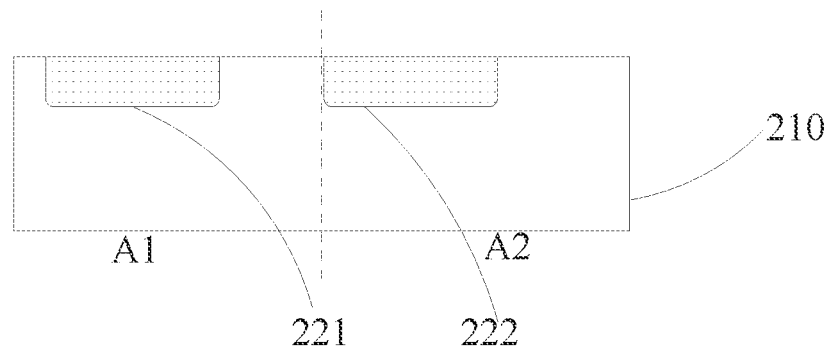
FIG. 3 illustrates a structural schematic diagram of an exemplary structure after forming a first active area and a second active area, according to some aspects of the present disclosure.
Figure 4:
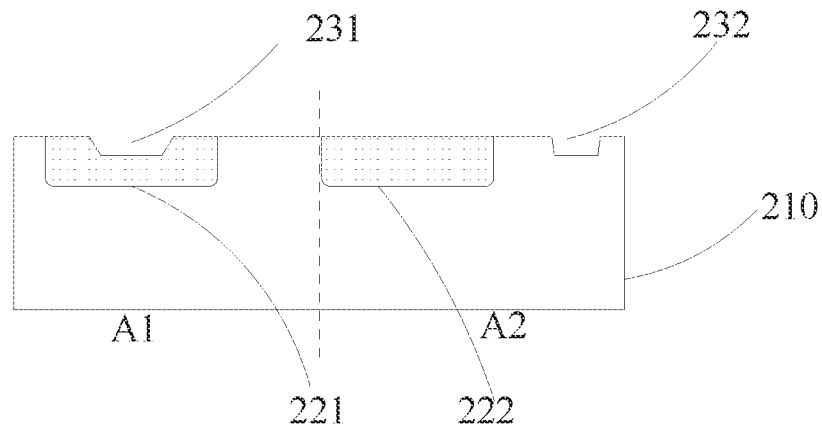
FIG. 4 illustrates a structural schematic diagram of an exemplary structure after forming a first recess and a second recess, according to some aspects of the present disclosure.

In step S105, the first device region A1 and the second device region A2 are ion doped. As shown in FIG. 3, the structure formed in step S105 may include the substrate 210, and a first active area 221 and a second active area 222. In some implementations, the first device region A1 and the second device region A2 are ion doped, so that the first active area 221 and the second active area 222 are formed in the first device region A1 and the second device region A2 respectively. In some implementations, a first recess 231 may be disposed in the first active area 221 (i.e., in the first device region A1) and a second recess 232 may be disposed in the second active area 222 (i.e., in the second device region A2). In some implementations, the second recess 232 may be disposed outside the second active area 222 in the second device region A2, as shown in FIG. 4. An active area (AA) refers to an area in which a source, a drain and a conductive channel are formed. After step S101, the substrate 210 may be ion-implanted one or more times to form well regions, and then separated into regions by an etching process. In some implementations, the regions may be the first active area 221 or the second active area 222. That is, the first active area 221 and the second active area 222 are formed in the substrate 210.

Different from a logic chip, a 3D memory may need to perform the operations of reading, writing and erasing. Different operations need different operating voltages, so that a plurality of devices to provide different maximum operating voltages are needed in a peripheral circuitry of the 3D memory, and accordingly a high voltage (HV) device region and a low voltage (LV) device region need to be formed in the peripheral circuitry of the 3D memory. In some implementations, the first device region A1 may be an LV device region and the second device region A2 may be an HV device region.

In step S102, a plurality of first recesses 231 are formed in the first device region A1, a second recess 232 is formed in the second device region A2, and the first recesses 231 and the second recess 232 are formed simultaneously.

As shown in FIG. 4, the structure formed in step S102 includes the substrate 210, the first active area 221 and the first recess 231 therein, and the second active area 222 and the second recess 232 therein. In some implementations, in the first active area 221 and the second active area 222 respectively, the first recess 231 and the recess 232 may be formed in the vertical direction perpendicular to the substrate 210 by an etching process.

In step S103, a first isolation trench 241 is formed in the first device region A1 for separating adjacent first recesses 231. In step S104, a second isolation trench 242 is formed in the second device region A2 at the position of the second recess 232.

Figure 5:
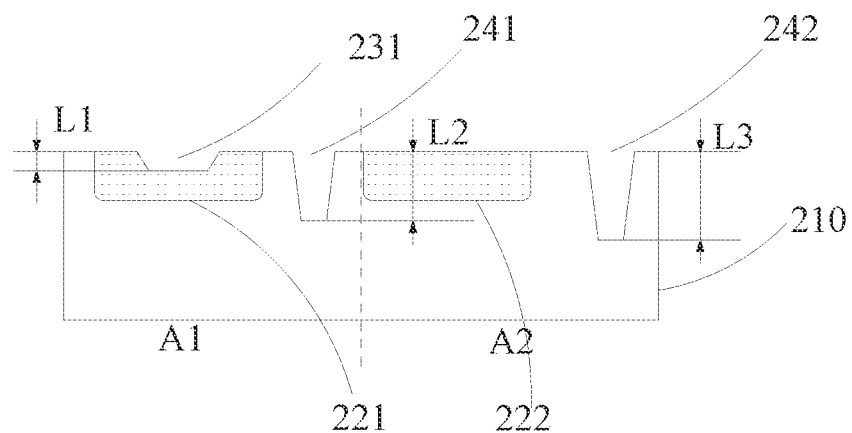
FIG. 5 illustrates a structural schematic diagram of an exemplary structure after forming a first isolation trench and a second isolation trench, according to some aspects of the present disclosure.

As shown in FIG. 5, the structure formed after steps S103 and S104 includes: the substrate 210; the first active area 221, the first recess 231 and the first isolation trench 241 in the first active area 221; and the second active area 222 and the second isolation trench 242 in the second active area 222. In some implementations, the first recess 231 may have a depth L1, the first isolation trench 241 may have a depth L2, and the second isolation trench 242 may have a depth L3. In some implementations, the depth L3 of the second isolation trench 242 may be larger than the depth L2 of the first isolation trench 241.

In some implementations, the first recess 231 and the second recess 232 may be formed simultaneously in the substrate 210 by an etching process and thus have a consistent depth, i.e., the same depth L1. After the formation of the first recess 231 and the second recess 232, in some implementations, the first isolation trench 241 is formed in the first active area 221 at a position other than the position of the first recess 231 by an etching process and the second isolation trench 242 is formed in the second device region at the position of the second recess 232. The "at the position of the second recess 232" here is to mean that the etching continues downwards from the bottom of the second recess 232 to form the second isolation trench 242. By forming the second recess 232 and the first recess 231 simultaneously and forming the second isolation trench 242 at the position of the second recess 232, the depth L3 of the second isolation trench 242 is larger than the depth L2 of the first isolation trench 241, so that the first isolation trench 241 and the second isolation trench 242 of different depths are formed in the first device region A1 and the second device region A2 respectively to satisfy isolation requirements of different semiconductor devices without adding any processes.

In some implementations, the first isolation trench 241 and the second isolation trench 242 are formed simultaneously. In some implementations, when steps S103 and S104 are performed simultaneously, i.e., when the first isolation trench 241 and the second isolation trench 242 are formed simultaneously, the first isolation trench 241 is formed in the first active area 221 at a position other than the position of the first recess 231 by an etching process, and at the same time, the second isolation trench 242 is formed in the second device region A2 at the position of second recess 232. Hence, the etching continues downwards from the bottom of the second recess 232 to form the second isolation trench 242. In some implementations, the etching operation from the bottom of the second recess 232 proceeds through a depth that is equal to the depth L2 of the first isolation trench 241, so that the depth L3 of the second isolation trench 242 is the sum of the depth L1 of the first recess 231 and the depth L2 of the first isolation trench 241. By forming the first isolation trench and the second isolation trench of different depths simultaneously, isolation requirements of different devices can be satisfied and meanwhile process flow is simplified and fabrication cost is saved, making further development of semiconductor technology possible.

Additionally, it is to be noted that the depth L3 of the second isolation trench 242 is generally the sum of the depth L1 of the first recess 231 and the depth L2 of the first isolation trench 241. In some implementations, since the second isolation trench 242 is formed by etching from the second recess 232 and the first isolation trench 241 is formed by etching not from the first recess 231, the first isolation trench 241 and the second isolation trench 242 are etched from different starting depths, based on which, as the etching proceeds and the depth increases, the depth to be etched will be influenced by the etched depth. In some implementations, the depth L3 of the second isolation trench 242 may deviate somewhat from the sum of the depth L1 of the first recess 231 and the depth L2 of the first isolation trench 241. Nevertheless, the depth L3 of the second isolation trench 242 is positively correlated with the sum of the depth L1 of the first recess 231 and the depth L2 of the first isolation trench 241. In some implementations, the depth L3 of the second isolation trench 242 always corresponds to the sum of the depth L1 of the first recess 231 and the depth L2 of the first isolation trench 241.

After step S104, the method may further include filling a dielectric material into the first isolation trench 241 and the second isolation trench 242 to form a first isolation structure 243 and a second isolation structure 244. In some implementations, the dielectric material may include silicon oxide.

Figure 6:
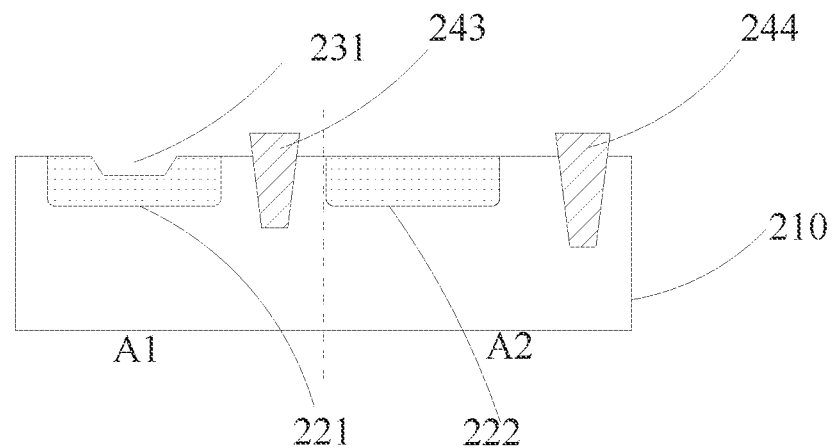
FIG. 6 illustrates a structural schematic diagram of an exemplary structure after forming a first isolation structure and a second isolation structure, according to some aspects of the present disclosure.

In some implementations, as shown in FIG. 6, there are also a plurality of isolation structures in the first active area 221 and the second active area 222 and between the first active area 221 and the second active area 222, such as the first isolation structure 243 in the first active area 221 and the second isolation structure 244 in the second active area 222, which may each be a shallow trench isolation (STI) and used to laterally isolate NMOS devices and PMOS devices. In some implementations, the dielectric material may be filled by a thermal oxidation into the first isolation trench 241 and the second isolation trench 242 respectively to form the first isolation structure 243 and second isolation structure 244. Since the depth L3 of the second isolation trench 242 always corresponds to the sum of the depth L1 of the first recess 231 and the depth L2 of the first isolation trench 241, the depth of the second isolation structure 244 is larger than that of the first isolation structure 243, so that isolation requirements of different semiconductor devices can be satisfied. In some implementations, the material of the STI is oxide, e.g., silicon dioxide (SiO2). Additionally, it is to be noted that the dielectric material filled into the first isolation trench 241 and the second isolation trench 242 is not limited as long as it can perform the function of lateral isolation.

In some implementations, after step S104, the method may further include step S106. In step S106, a first dielectric layer 251 is formed in the first device region A1, the first dielectric layer 251 being at least partially over the inner walls of the first recess 231.

Figure 7:
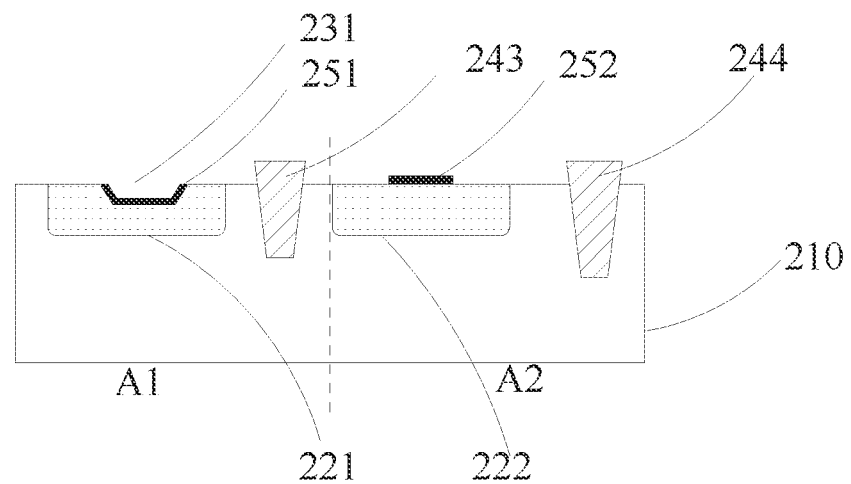
FIG. 7 illustrates a structural schematic diagram of an exemplary structure after forming a first dielectric layer, according to some aspects of the present disclosure.

As shown in FIG. 7, the structure formed in step S106 may include: the substrate 210; the first active area 221 and the first isolation structure 243 in the first active area 221, the first recess 231 and the first dielectric layer 251 in the first recess 231; and the second active area 222 and the second isolation structure 244 in the second active area 222. In some implementations, the first dielectric layer 251 is at least partially over the inner walls of the first recess 231 and is lower than the top surface of the substrate 210. In some implementations, as shown in FIG. 7, a second dielectric layer 252 may also be formed on the second device region A2.

In some implementations, the first recess 231 in the substrate 210 is used to form a gate corresponding to the first recess 231, and the first dielectric layer 251 in the first recess 231 serves as the gate oxide layer to insulate the gate from the substrate 210. In some implementations, the substrate 210 is made of silicon, whose natural oxide is silicon dioxide. When silicon is exposed to an environment with oxidizer at a relatively high temperature, a thin layer of oxide is gradually formed on a surface of silicon in contact with the oxidizer. Dielectric layers of high quality, for example, the first dielectric layer 251 as the gate oxide layer, may be formed by a thermal oxidation. Moreover, in some implementations, thermally grown oxide may be used as a mask for implantation, diffusing and etching.

In some implementations, the second dielectric layer 252 may be formed by a method that is substantially the same as the method of forming the first dielectric layer 251 and may be adjusted in accordance with the position, thickness and width of the second dielectric layer 252, and so on. Since the method of forming the first dielectric layer 251 has been described above in detail, no repetition will be made here.

In some implementations, the thermal oxidation refers to a silicon wafer in an atmosphere of gas oxidizer, such as molecular oxygen (O2) and/or water vapor (H2O), at a high temperature (e.g., in the range of 900-1200° C.). The thermal oxidation is dry oxidation when the gas oxidizer is molecular oxygen, and the thermal oxidation is wet oxidation when the gas oxidizer is water vapor. During the thermal oxidation, an initial oxide layer is first formed at the gas/solid interface, and the oxidizer needs to penetrate through the initial oxide layer and reach the surface of the wafer by diffusing so as to form an oxide layer. The oxidizer, upon reaching the surface of the wafer, must penetrate through the newly formed oxide layer. By repeat this cycle, the first dielectric layer 251 is eventually formed. The first dielectric layer 251 may be formed with a controlled thickness by controlling the temperature, speed constants (such as type of the oxidizer and surface property of the wafer) and duration of the thermal oxidation, so that the first dielectric layer 251 may have a thickness less than the depth of the first recess 231. In some implementations, the first dielectric layer 251 is at least partially over the inner walls of the first recess 231 and has a height lower than the top surface of the substrate 210.

Figure 8:
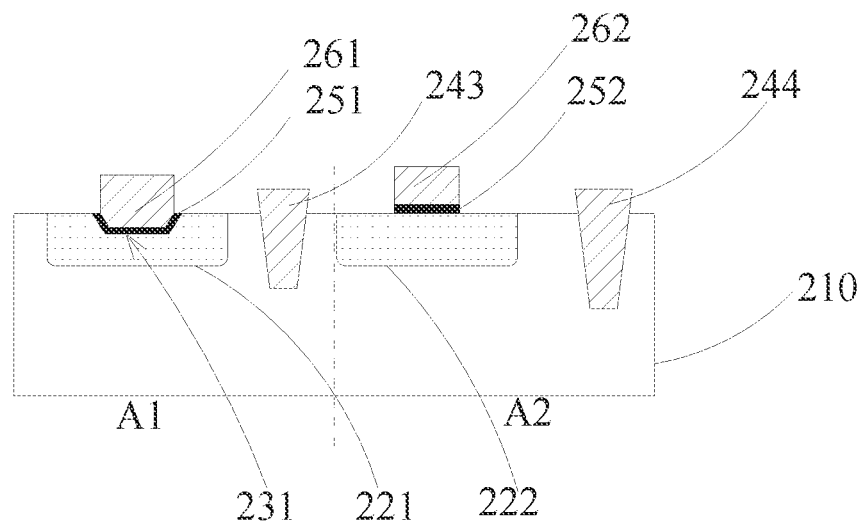
FIG. 8 illustrates a structural schematic diagram of an exemplary structure after forming a first gate, according to some aspects of the present disclosure.

In step S107, a first gate 261 is formed on the first dielectric layer 251 and a source and a drain are formed on both sides of the first gate 261 respectively. As shown in FIG. 8, the structure formed in the operation of forming the first gate 261 on the first dielectric layer 251 in step S107 may include: the substrate 210; the first active area 221 and the first isolation structure 243 in the first active area 221, the first recess 231 and the first dielectric layer 251 and the first gate 261 in the first recess 231; and the second active area 222 and the second isolation structure 244 in the second active area 222. In some implementations, the first gate 261 has one portion in the first recess 231 and the other portion above the top surface of the substrate 210. In some implementations, as shown in FIG. 8, a second gate 262 may also be formed on the second dielectric layer 252 in the second device region A2.

In some implementations, after the formation of the first dielectric layer 251, a conductive material is filled into the first recess 231 by a physical vapor deposition (PVD) to form the first gate 261 in the first recess 231, with the first gate 261 having one portion in the first recess 231 and the other portion above the top surface of the substrate 210, i.e., with the top of the first gate 261 above the top of the substrate 210. In some implementations, in order to achieve a recess gate, the first recess 231 is formed in the substrate 210 and then the first dielectric layer 251 and the first gate 261 are sequentially formed in the first recess 231, so that the formed first gate 261 has one portion in the substrate 210 and the other portion above the substrate 210. By using the recess gate, an effective area of contact between the first gate 261 and the first active area 221 is increased and the channel for the first gate 261 is elongated, so that the problem of slow reading/writing of the semiconductor devices can be alleviated and thus footprint of the semiconductor device can be smaller. In some implementations, by forming the first isolation structure 243 and the second isolation structure 244 of different depths in different active areas, i.e., by using a dual STI process, isolation requirements of different semiconductor devices can be satisfied. By integration of the recess gate process and the dual STI process, the footprint of the peripheral circuitry can be reduced effectively and isolation requirements of different semiconductor devices can be satisfied, making further development of semiconductor technology possible.

In some implementations, the second gate 262 may be formed by a method that is substantially the same as the method of forming the first gate 261 and may be adjusted in accordance with the position of the second dielectric layer 252, the thickness and width of the second gate 262, and so on. Since the method of forming the first gate 261 has been described above in detail, no repetition will be made here.

In some implementations, the first gate 261 is used to control a semiconductor device to turn on/off, and thus often chosen to be conductive materials, such as but not limited to, polysilicon (Poly), tungsten (W), aluminum (Al) or any other conductive materials.

Figure 9:
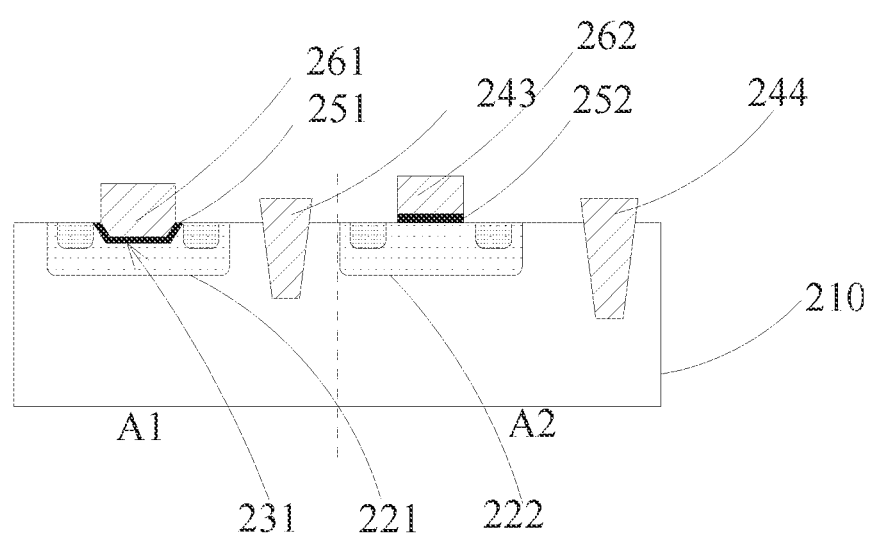
FIG. 9 illustrates a structural schematic diagram of the formed semiconductor structure, according to some aspects of the present disclosure.

As shown in FIG. 9, the structure formed in the operation of forming the source and drain on both sides of the first gate 261 respectively in step S107 may include: the substrate 210; the first active area 221 and the first isolation structure 243 in the first active area 221, the first recess 231, the first dielectric layer 251 in the first recess 231, and the first transistor corresponding to the first gate 261; and the second active area 222 and the second isolation structure 244 in the second active area 222. In some implementations, the first gate 261 has one portion in the substrate 210 and the other portion above the substrate 210. Additionally, as shown in FIG. 9, a source and a drain may also be formed on both sides of the second gate 262 respectively in the second device region A2.

In some implementations, thermally grown oxide may be used as a mask for ion implantation, diffusing and etching. In some implementations, after the first dielectric layer 251 has been formed as the gate oxide layer, the first gate 261 is formed on the first dielectric layer 251. Since the first gate 261 is very thick and has its top located above the top of the substrate 210, the first gate 261 may be used as a mask layer for the formation of the source and drain to prevent ions from being implanted into the region under the first gate 261. This is because the first gate 261 is thick enough so that ion-implanted atoms cannot reach the first dielectric layer 251. Therefore, the source and drain are formed only on both sides of the first gate 261, because the ion-implanted atoms can easily penetrate through the gate oxide layer over the source and drain to be formed. In some implementations, by means of the first gate 261, a self-alignment is achieved between the source, drain and the first gate 261.

In some implementations, the source and drain for the second gate 262 may be formed by a method that is substantially the same as the method of forming the source and drain for the first gate 261 and may be adjusted in accordance with the position, thickness and width of the second gate 262, the positions, widths and depths of the source and drain for the second gate 262, and so on. Since the method of forming the source and drain for the first gate 261 has been described above in detail, no repetition will be made here.

In some implementations, the transistors may be classified into PMOS transistors and NMOS transistors. A PMOS transistor is also referred to as a P-type metal oxide semiconductor and an NMOS transistor is also referred to as an N-type metal oxide semiconductor. The first transistor includes the first gate 261 and the source and drain on both sides of the gate. By applying a driving voltage to the first gate 261, the conductive pathway from the source to the drain, and in turn the circuitry in the semiconductor device, is controlled to turn on/off.

Figure 10:
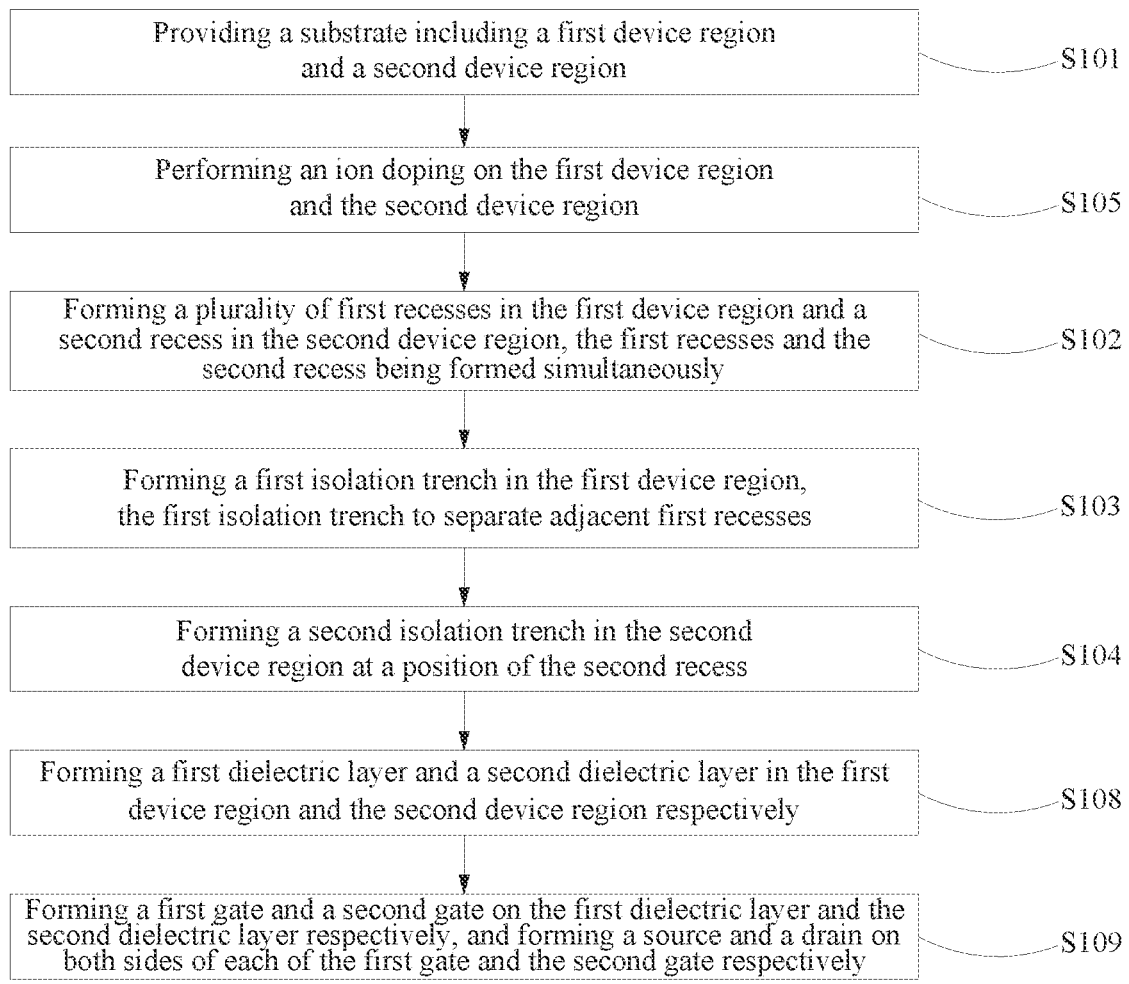
FIG. 10 illustrates a flowchart illustrating a method of fabricating an exemplary semiconductor structure, according to some aspects of the present disclosure.

All the steps described above belong to some implementations of the present application, in which the first isolation trench and the second isolation trench of different depths can be formed simultaneously, so that isolation requirements of different semiconductor devices can be satisfied and meanwhile the process flow is simplified and fabrication cost is saved. FIG. 10 shows a flowchart of a method of fabricating a semiconductor structure according to some implementations of the present disclosure. As shown in FIG. 10, the method has a specific process flow including the following operations corresponding to the structural diagrams in FIG. 2, FIG. 3 and FIGS. 11-16.

Here, a plurality of third recesses 333 are formed in the second device region A2 while forming the second recess 332, with the second recess 332 located between adjacent third recesses 333.

Figure 11:
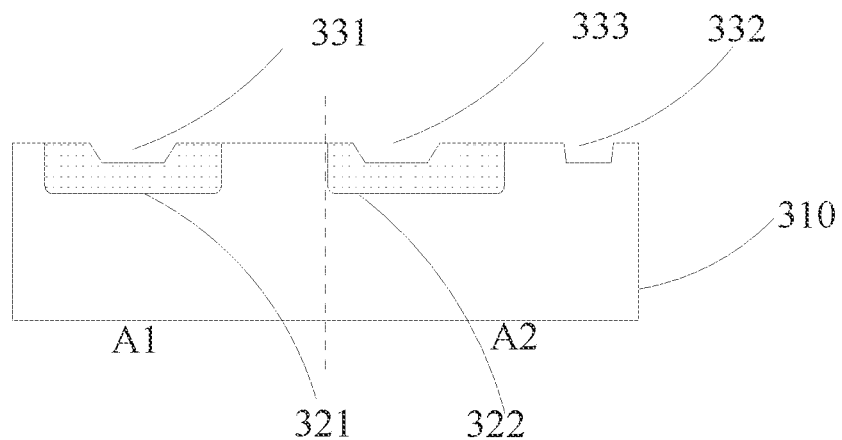
FIG. 11 illustrates a structural schematic diagram of an exemplary structure after forming a first recess, a second recess and a third recess, according to some aspects of the present disclosure.

In some implementations, different from the structure shown in FIG. 4 that is formed in step S102, which has the substrate 210 and the first recess 231 and the second recess 232 formed in the substrate 210, a structure is shown in FIG. 11, which is a structural schematic diagram illustrating the formation of the first recess 331, the second recess 332 and the third recess 333 according to some implementations of the present disclosure. As shown in FIG. 11, the structure may include the substrate 310; the first active area 321 and the first recess 331 in the first active area 321; and the second active area 322 and the second recess 332 and the third recess 333 in the second active area 322.

Figure 12:
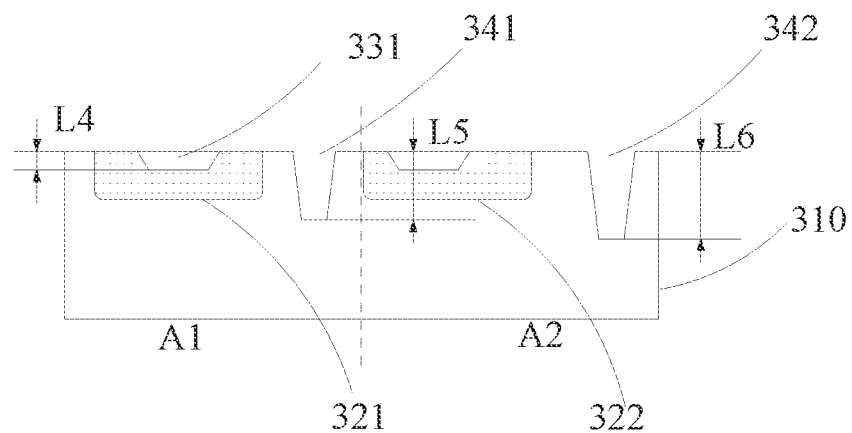
FIG. 12 illustrates a structural schematic diagram of an exemplary structure after forming a first isolation trench and a second isolation trench, according to some aspects of the present disclosure.

When the substrate 310 has the first recess 331, the second recess 332 and the third recess 333 formed therein, the subsequent steps S103 and S104 need to be adjusted in accordance with the third recess 333. Then, steps S103 and S104 are adjusted in accordance with the third recess 333. As shown in FIG. 12, the structure formed in the adjusted steps S103 and S104 may include: the substrate 310; the first active area 321 and the first recess 331 and the first isolation trench 341 in the first active area 321; and the second active area 322 and the second isolation trench 342 and the third recess 333 in the second active area 322. In some implementations, the first recess 331 has a depth L4, the first isolation trench 341 has a depth L5, and the second isolation trench 342 has a depth L6, with the depth L6 of the second isolation trench 342 being the sum of the depth L4 of the first recess 331 and the depth L5 of the first isolation trench 341.

In some implementations, after step S104, the method further includes filling a dielectric material into the first isolation trench 341 and the second isolation trench 342 to form the first isolation structure 343 and second isolation structure 344.

Figure 13:
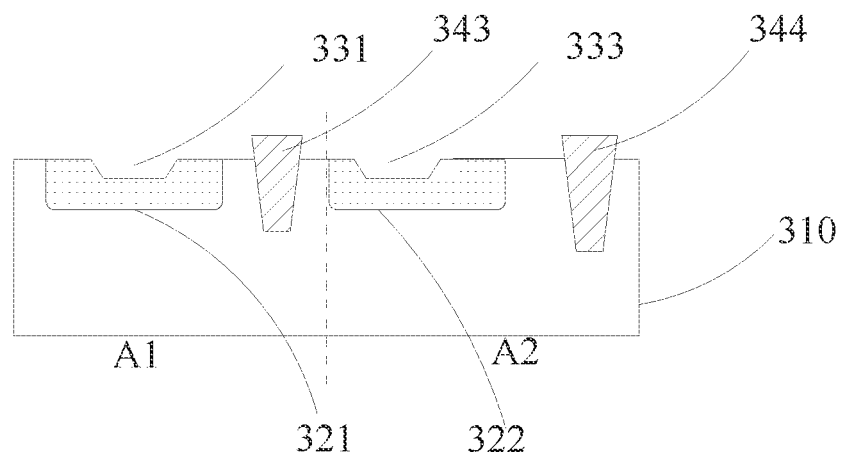
FIG. 13 illustrates a structural schematic diagram of an exemplary structure after forming a first isolation structure and a second isolation structure, according to some aspects of the present disclosure.

In some implementations, as shown in FIG. 13, there are a plurality of isolation structures in the first active area 321 and the second active area 322 and between the first active area 321 and the second active area 322, such as the first isolation structure 343 and the second isolation structure 344, which may each be a shallow trench isolation (STI) and used to laterally isolate NMOS devices and PMOS devices. The first isolation structure 343 and second isolation structure 344 may be formed in the first isolation trench 341 and the second isolation trench 342 respectively by a thermal oxidation. Since the depth L6 of the second isolation trench 342 always corresponds to the sum of the depth L4 of the first recess 331 and the depth L5 of the first isolation trench 341, the depth of the second isolation structure 344 corresponds to the depth L4 of the first recess 331 and the depth of the first isolation structure 343, so that isolation requirements of different semiconductor devices can be satisfied. In some implementations, the material of the STI is oxide, e.g., silicon dioxide.

Figure 14:
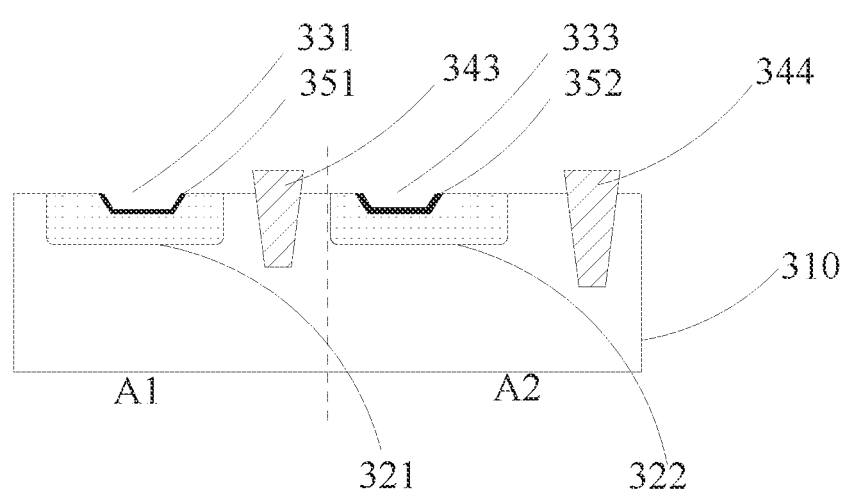
FIG. 14 illustrates a structural schematic diagram of an exemplary structure after forming a first dielectric layer and a second dielectric layer, according to some aspects of the present disclosure.
Figure 15:
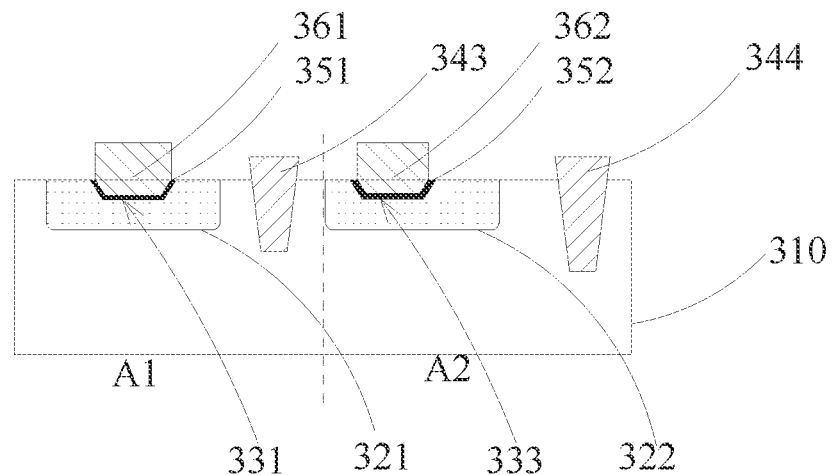
FIG. 15 illustrates a structural schematic diagram of an exemplary structure after forming a first gate and a second gate, according to some aspects of the present disclosure.
Figure 16:
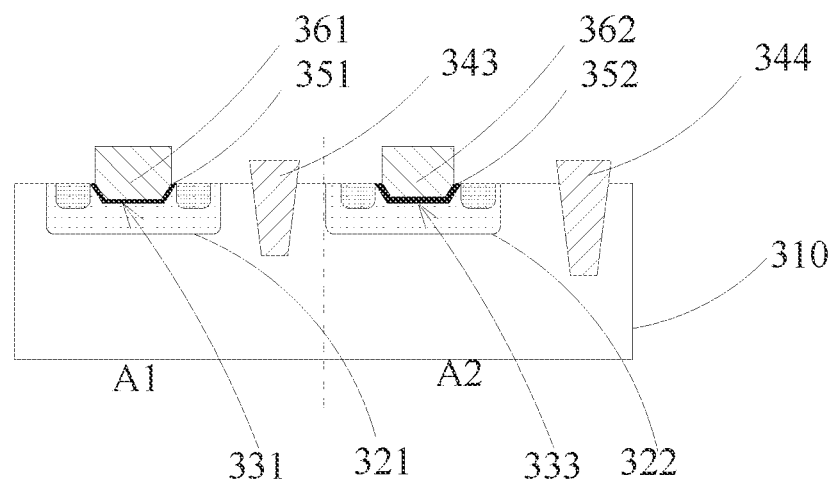
FIG. 16 illustrates a structural schematic diagram of the formed semiconductor structure, according to some aspects of the present disclosure.

When the substrate 310 has the first recess 331, the second recess 332 and the third recess 333 formed therein, the subsequent steps S106 and S107 need to be adjusted in accordance with the third recess 333 to for example, steps S108 and S109, which may be illustrated by the structural diagrams in FIGS. 14-16.

In some implementations, after step S104, the method further includes S108. In step S108, a first dielectric layer 351 and a second dielectric layer are formed in the first device region and the second device region respectively. In some implementations, the first dielectric layer 351 is at least partially over the inner walls of the first recess, the second dielectric layer is at least partially over the inner walls of the third recess, and the thickness of the first dielectric layer is less than that of the second dielectric layer.

As shown in FIG. 14, the structure formed in step S108 may include: the substrate 310; the first active area 321 and the first isolation structure 343 in the first active area 321, the first recess 331 and the first dielectric layer 351 in the first recess 331; the second active area 322 and the second isolation structure 344 in the second active area 322, the third recess 333 and the second dielectric layer 352 in the third recess 333. In some implementations, the first dielectric layer 351 is at least partially over the inner walls of the first recess 331, the second dielectric layer 352 is at least partially over the inner walls of the second recess 333, and each of the first dielectric layer 351 and the second dielectric layer 352 has a height lower than the top surface of the substrate 310.

In step S109, a first gate 361 and a second gate 362 are formed on the first dielectric layer 351 and the second dielectric layer 352 respectively, and a source and a drain are formed on both sides of each of the first gate 361 and the second gate 362 respectively.

As shown in FIG. 15, the structure formed in the operation of forming the first gate 361 and the second gate 362 on the first dielectric layer 351 and the second dielectric layer 352 respectively in step S109 may include: the substrate 310; the first active area 321 and the first isolation structure 343 in the first active area 321, the first recess 331, and the first dielectric layer 351 and the first gate 361 in the first recess 331; and the second active area 322 and the second isolation structure 344 in the second active area 322, the third recess 333, and the second dielectric layer 352 and the second gate 362 in the third recess 333. In some implementations, the first gate 361 and the second gate 362 each have one portion in the substrate 310 and the other portion above the substrate 310.

In some implementations, the gates are used to control semiconductor devices to turn on/off. In some implementations, the first gate 361 and the second gate 362 are often chosen to be conductive materials, such as but not limited to polysilicon (Poly), tungsten (W), aluminum (Al), or any other conductive materials.

In some implementations, after the formation of the first dielectric layer 351 and the second dielectric layer 352, conductive materials may be filled into the first recess 331 and the third recess 333 by a physical vapor deposition (PVD) to form the first gate 361 and the second gate 362 corresponding to the first recess 331 and the third recess 333 respectively. Each of the first gate 361 and the second gate 362 has one portion in the corresponding recess and the other portion above the substrate 310. In some implementations, the tops of the first gate 361 and the second gate 362 are both above the top of the substrate 310. In order to achieve recess gates, the first recess 331 and the third recess 333 are formed in the substrate 310, and then the first dielectric layer 351 and the first gate 361 are sequentially formed in the first recess 331 and at the same time the second dielectric layer 352 and the second gate 362 are sequentially formed in the third recess 333 so that the formed first gate 361 has one portion in the first recess 331 and the other portion above the top surface of the substrate 310 and the formed second gate 362 has one portion in the third recess 333 and the other portion above the top surface of the substrate 310. By using the recess gates, effective areas of contact between the gates and the active areas are increased and the channels for the first gate 361 and the second gate 362 are elongated, so that the problem of slow reading/writing of the semiconductor devices can be alleviated and thus footprint of the semiconductor devices can be smaller. In some implementations, by forming the first isolation structure 343 and the second isolation structure 344 of different depths simultaneously, i.e., by using a dual STI process, isolation requirements of different semiconductor devices can be satisfied and meanwhile the process flow is simplified and fabrication cost is saved. By integration of the recess gate process and the dual STI process, the footprint of the peripheral circuitry can be reduced effectively and isolation requirements of different semiconductor devices can be satisfied, making further development of semiconductor technology possible.

As shown in FIG. 16, the structure formed in the operation of forming a source and a drain on both sides of each of the first gate 361 and the second gate 362 respectively in step S109 may include: the substrate 310; the first active area 321 and the first isolation structure 343 in the first active area 321, the first recess 331, and the first dielectric layer 351 in the first recess 331 and the first transistor corresponding to the first gate 361; and the second active area 322 and the second isolation structure 344 in the second active area 322, the third recess 333, and the second dielectric layer 352 in the third recess 333 and the second transistor corresponding to the second gate 362. In some implementations, the first gate 361 has one portion in the first recess 331 and the other portion above the top surface of the substrate 310 and the second gate 362 has one portion in the third recess 333 and the other portion above the top surface of the substrate 310.

In some implementations, a transistor includes a gate and a source and a drain on both sides of the gate. By applying a driving voltage to the gate, the conductive pathway from the source to the drain, and in turn the circuitry in the semiconductor device, is controlled to turn on/off.

Figure 17:
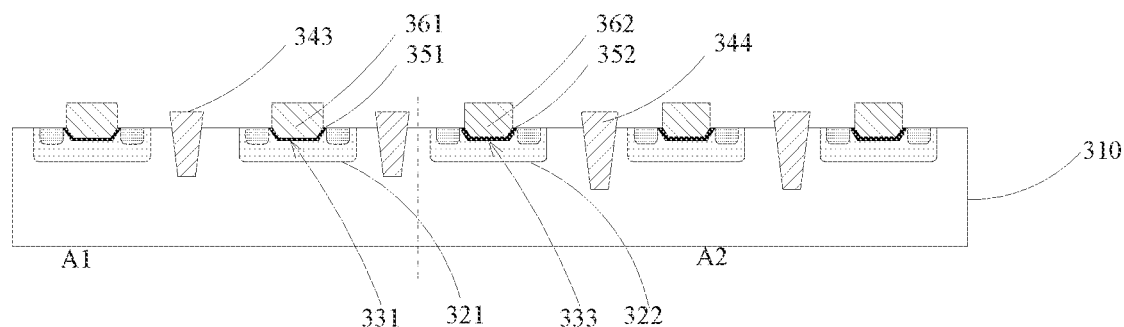
FIG. 17 illustrates a structural schematic diagram of the formed semiconductor structure including a plurality of transistors, according to some aspects of the present disclosure.

FIG. 17 is a structural schematic diagram of a semiconductor device having a plurality of first transistors formed in the first device region and a plurality of second transistors formed in the second device region. As shown in FIG. 17, a plurality of first transistors are formed in the first device region A1 and first isolation structures 343 are formed between the first transistors to isolate them from each other; and a plurality of second transistors are formed in the second device region A2 and second isolation structures 344 are formed between the second transistors to isolate them from each other. In some implementations, the first device region A1 and the second device region A2 are an LV device region and an HV device region respectively. By forming shallow trench isolation structures of different depths in different device regions, i.e., by making the depth of the second isolation structure 344 larger than the depth of the first isolation structure 343, isolation requirements of different semiconductor devices can be satisfied.

Furthermore, it is to be noted that the specific process flow of steps S106 and S107 has been discussed in detail above, and the steps S108 and S109 for forming the structural schematic diagrams of FIGS. 14-16 have substantially the same specific process flow as steps S106 and S107, and are only adjusted in accordance with the third recess 333, so that the related description will not be repeated here.

With development of semiconductor devices, more devices with different maximum operating voltages are needed and correspondingly a third device region is also formed in the peripheral circuitry of a 3D memory, the third device region being on the side of the first device region A1 away from the second device region A2. In some implementations, the third device region (not shown in the figures), the first device region A1 and the second device region A2 may be a super-low voltage device region, a low voltage device region and a high voltage device region respectively.

Furthermore, in addition to the super-low voltage device region, low voltage device region and high voltage device region, one or more device regions distinct from them may be formed in the peripheral circuitry, which is subject to no limitation. When the third device region or more other device regions exist in the semiconductor structure, a plurality of recess gates may be formed in the third device region or more other device regions, and STI structures of different depths may be formed in the different device regions by a process flow similar to steps S101-S107, to satisfy isolation requirements of different semiconductor devices. Since the principle is similar to the one that has been detailed above, no repetition will be made here.

Based on the method of fabricating a semiconductor structure according to some implementations of the present disclosure, a semiconductor structure is provided in the disclosure. The semiconductor structure may include a substrate 210 including a first device region and a second device region; a plurality of first transistors disposed in the first device region and a first isolation structure 243 located between adjacent first transistors, the first transistor having a first gate 261 at least partially located in a first recess 231; and a plurality of second transistors disposed in the second device region and a second isolation structure located between adjacent second transistors, the depth of the second isolation structure 244 being larger than the depth of the first isolation structure 243. In some implementations, the depth of the second isolation structure 244 is the sum of the depth of the first isolation structure 243 and the depth of the first recess 231.

FIG. 9 is a structural schematic diagram of a semiconductor structure formed according to some implementations of the present disclosure. As shown in FIG. 9, the semiconductor structure may include: the substrate 210; the first active area 221 and the first isolation structure 243 in the first active area 221, the first recess 231, and the first dielectric layer 251 in the first recess 231 and the first transistor corresponding to the first gate 261; and the second active area 222 and the second isolation structure 244 in the second active area 222. In some implementations, the first gate 261 has one portion in the first recess 231 and the other portion above the top surface of the substrate 210, and the depth of the second isolation structure 244 corresponds to the sum of the depth of the first recess 231 and the depth of the first isolation structure 243.

In some implementations, the semiconductor structure further includes a first transistor including a first dielectric layer 251 that is at least partially located in the first recess 231, a first gate 261 of the first transistor located on the first dielectric layer 251.

In some implementations, FIG. 9 is a structural schematic diagram of the semiconductor structure formed by performing steps S101-107. As shown in FIG. 9, in order to achieve a recess gate, the first recess 231 is formed in the substrate 210 and then the first dielectric layer 251 and the first gate 261 are sequentially formed in the first recess 231 so that the formed first gate 261 has one portion in the first recess 231 and the other portion above the top surface of the substrate 210. By using the recess gate, effective area of contact between the gate and the active area is increased and the channel for the first gate 261 is elongated, so that the problem of slow reading/writing of the semiconductor devices can be alleviated and thus footprint of the semiconductor devices can be smaller. In some implementations, by forming the first isolation trench and the second isolation trench of different depths simultaneously, isolation requirements of different semiconductor devices can be satisfied and meanwhile the process flow is simplified and fabrication cost is saved. By integration of the recess gate process and the dual STI process, the footprint of the peripheral circuitry can be reduced effectively and isolation requirements of different semiconductor devices can be satisfied, making further development of semiconductor technology possible.

In some implementations, the semiconductor structure may further include: a first transistor including a first dielectric layer 351 at least partially located in a first recess 331, a first gate 361 of the first transistor on the first dielectric layer 351; and a second transistor including a second dielectric layer 352 at least partially located in a third recess 333, a second gate 362 of the second transistor at least partially located in the third recess 333, and the thickness of the first dielectric layer 351 being less than that of the second dielectric layer 352.

In some implementations, different from the scheme shown in FIG. 9, FIG. 16 shows a structural schematic diagram of a semiconductor structure formed according to some implementations of the present disclosure. As shown in FIG. 16, the semiconductor structure may include: the substrate 310; the first active area 321 and the first isolation structure 343 in the first active area 321, the first recess 331, and the first dielectric layer 351 in the first recess 331 and the first transistor corresponding to the first gate 261; and the second active area 322 and the second isolation structure 344 in the second active area 322, the third recess 333, and the second dielectric layer 352 in the third recess 333 and the second transistor corresponding to the second gate 362. In some implementations, each of the first gate 361 and the second gate 362 has one portion in the substrate 310 and the other portion above the substrate 310 and the depth of the second isolation structure 344 corresponds to the sum of the depth of the first recess 331 and the depth of the first isolation structure 343.

In some implementations, as shown in FIG. 11, when the substrate 310 has the first recess 331, the second recess 332 and the third recess 333 formed therein, the subsequent steps S103-S106 need to be adjusted in accordance with the third recess 333 so as to obtain the semiconductor structure shown in the structural schematic diagram of FIG. 16. Related details described above will not be repeated here. In order to achieve recess gates, the first recess 331, the second recess 332 and the third recess 333 are formed in the substrate 310, then the first dielectric layer 351 and the first gate 361 are sequentially formed in the first recess 331, and the second dielectric layer 352 and the second gate 362 are sequentially formed in the third recess 333 so that the formed first gate 361 has one portion in the first recess 331 and the other portion above the top surface of the substrate 310 and the formed second gate 362 has one portion in the third recess 333 and the other portion above the top surface of the substrate 310. By using the recess gates, effective areas of contact between the gates and the active areas are increased and the channels for the first gate 361 and the second gate 362 are elongated, so that the problem of slow reading/writing of the semiconductor devices can be alleviated and thus footprint of the semiconductor devices can be smaller. By forming the first isolation structure 343 and the second isolation structure 344 of different depths simultaneously, isolation requirements of different semiconductor devices can be satisfied and meanwhile the process flow is simplified and fabrication cost is saved. By integration of the recess gate process and the dual STI process, the footprint of the peripheral circuitry can be reduced effectively and isolation requirements of different semiconductor devices can be satisfied, making further development of semiconductor technology possible.

In some implementations, the first device region A1 and the second device region A2 may be a low voltage device region and a high voltage device region respectively. Related details described above will not be repeated here.

With development of semiconductor devices, more devices with different maximum operating voltages are needed and correspondingly a third device region is also formed in the peripheral circuitry of a 3D memory, the third device region being on the side of the first device region A1 away from the second device region A2. In some implementations, the third device region, the first device region A1 and the second device region A2 may be a super-low voltage device region, a low voltage device region and a high voltage device region respectively.

In some implementations, in addition to the high voltage device region, low voltage device region and ultra-low voltage device region, one or more device regions distinct from them may be formed in the peripheral circuitry, which is subject to no limitation. When the third device region or more other device regions exist in the semiconductor structure, a plurality of recess gates may be formed in the third device region or more other device regions, and STI structures of different depths may be formed in the different device regions by a process flow similar to steps S101-S107 to satisfy isolation requirements of different semiconductor devices. Since the principle is similar to the one that has been detailed above, no repetition will be made here.

Based on the method of fabricating a semiconductor structure according to some implementations described above, the present disclosure also provides a 3D memory (not shown in the figures). The 3D memory includes an array memory structure and peripheral circuitry, wherein any of the semiconductor structures described above may be disposed in the peripheral circuitry.

In some implementations, the 3D memory (e.g., a 3D NAND Flash) includes an array memory structure, and peripheral circuitry including any of the semiconductor structures described above. In some implementations, the array memory structure is used to store information, and the peripheral circuitry may be above or below the array memory structure, or may be on four sides of the array memory structure, and the peripheral circuitry is used to control the array memory structure. Moreover, the semiconductor structures may be used in other microelectronic devices, such as, but not limited to, non-volatile flash (e.g., NOR flash).

Based on the semiconductor structures according to some implementations described above, the present application also provides a memory system, in which a controller is coupled to a 3D memory and used to control the 3D memory to store data, the 3D memory including any of the semiconductor structures described above.

Figure 18:
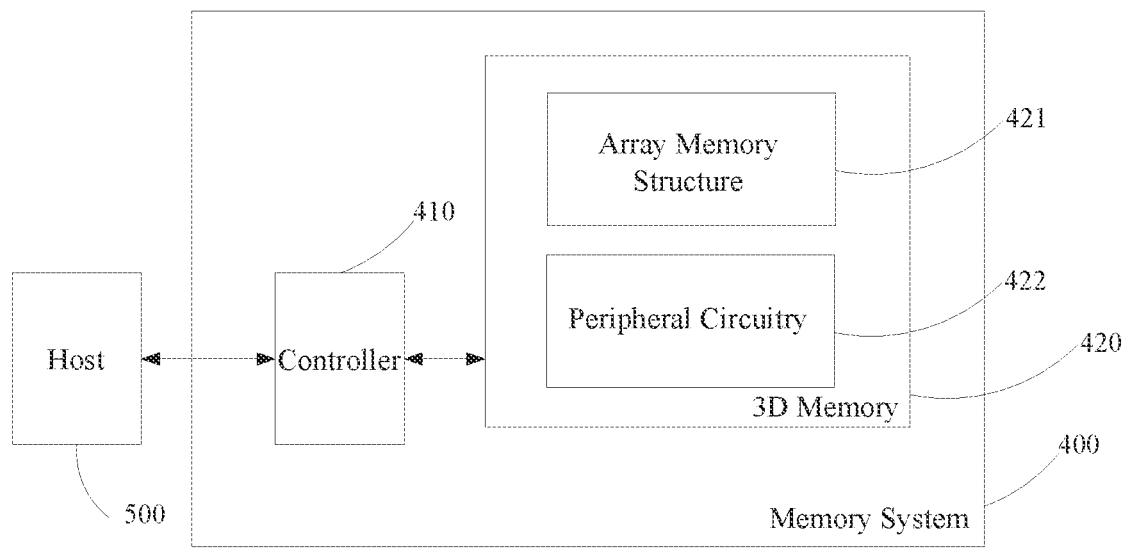
FIG. 18 illustrates a schematic block diagram of a memory system, according to some aspects of the present disclosure.

In some implementations, as shown in FIG. 18, a memory system 400 includes a controller 410 and one or more 3D memories 420 each having one or more array memory structures 421 and peripheral circuitry 422. The memory system 400 may communicate with a host 500 through the controller 410, which may be connected to the one or more 3D memories 420 through pathways in the one or more 3D memories 420. Each 3D memory 420 may be controlled by the controller 410 through the pathway in the 3D memory 420.

The foregoing description of the specific implementations can be readily modified and/or adapted for various applications. Therefore, such adaptations and modifications are intended to be within the meaning and range of equivalents of the disclosed implementations, based on the teaching and guidance presented herein.

The breadth and scope of the present disclosure should not be limited by any of the above-described exemplary implementations, but should be defined only in accordance with the following claims and their equivalents.

What is claimed is:

1. A method of fabricating a semiconductor structure, comprising:
   providing a substrate including a first device region and a second device region;
   forming a plurality of first recesses in the first device region and a second recess in the second device region, the first recesses and the second recess being formed simultaneously;
   forming a first isolation trench in the first device region at a position different from the plurality of first recesses to separate adjacent the plurality of first recesses; and
   forming a second isolation trench in the second device region at a position of the second recess.

2. The method of claim 1, wherein the first isolation trench and the second isolation trench are formed simultaneously.

3. The method of claim 2, before forming the plurality of first recesses, further comprising:
    performing an ion doping on the first device region and the second device region.

4. The method of claim 3, after forming the second isolation trench in the second device region at the position of the second recess, further comprising:
    forming a first dielectric layer in the first device region, the first dielectric layer being at least partially over inner walls of the first recesses; and
    forming a first gate on the first dielectric layer, and forming a source and a drain on both sides of the first gate respectively.

5. The method of claim 3, wherein a plurality of third recesses are formed in the second device region while forming the second recess, and the second recess is located between adjacent the plurality of third recesses.

6. The method of claim 5, wherein a first dielectric layer and a second dielectric layer are formed in the first device region and the second device region respectively, the first dielectric layer is at least partially over inner walls of the first recesses, the second dielectric layer is at least partially over inner walls of the third recesses, and a thickness of the first dielectric layer is less than that of the second dielectric layer; and
    a first gate and a second gate are formed on the first dielectric layer and the second dielectric layer respectively, and a source and a drain are formed on both sides of each of the first gate and the second gate respectively.

7. The method of claim 1, after forming the second isolation trench in the second device region at the position of the second recess, further comprising:
    filling a dielectric material into the first isolation trench and the second isolation trench respectively to form a first isolation structure and a second isolation structure.

8. A method of fabricating a semiconductor structure, comprising:
    forming a first active area in a first device region of a substrate and a second active area in a second device region of the substrate;
    performing a first removal operation to form a first recess in the first device region in the first active area and a second recess in the second device region outside the second active area; and
    performing a second removal operation to form a first isolation trench in the first device region outside the first active area and deepen the second recess to form a second isolation trench in the second device region outside the second active area.

9. The method of claim 8, further comprising:
    forming a first isolation structure in the first isolation trench and a second isolation structure in the second isolation trench,
    wherein a height of the first isolation structure is less than a height of the second isolation structure.

10. The method of claim 8, wherein a depth of the first isolation trench is less than a depth of the second isolation trench.

11. The method of claim 8, further comprising:
    forming a first dielectric layer in the first recess; and
    forming a first gate on the first dielectric layer,
    wherein a top surface of the first dielectric layer is at least partially below a top surface of the first device region.

12. The method of claim 11, further comprising:
    forming a second dielectric layer on the second active area; and
    forming a second gate on the second dielectric layer,
    wherein the top surface of the first dielectric layer is at least partially below a top surface of the second dielectric layer.

13. The method of claim 8, wherein performing the first removal operation to form the first recess in the first device region in the first active area and the second recess in the second device region outside the second active area, comprises:
    forming a third recess in the second device region in the second active area.

14. The method of claim 13, further comprising:
    forming a first dielectric layer in the first recess and a second dielectric layer in the third recess; and
    forming a first gate on the first dielectric layer and a second gate on the second dielectric layer,
    wherein a top surface of the first dielectric layer is at least partially below a top surface of the first device region, and a top surface of the second dielectric layer is at least partially below a top surface of the second device region.

15. The method of claim 8, wherein a depth of the second isolation trench is equal to a sum of a depth of the first isolation trench and a depth of the first recess.

16. A method of fabricating a semiconductor structure, comprising:
    providing a substrate including a first device region and a second device region;
    forming a plurality of first recesses in the first device region and a second recess in the second device region, the first recesses and the second recess being formed simultaneously;
    forming a first isolation trench in the first device region to separate adjacent the plurality of first recesses;
    forming a second isolation trench in the second device region at a position of the second recess;
    forming a first dielectric layer in the first device region, the first dielectric layer being at least partially over inner walls of the first recesses; and
    forming a first gate on the first dielectric layer, and forming a source and a drain on both sides of the first gate respectively.

17. The method of claim 16, wherein the first isolation trench and the second isolation trench are formed simultaneously.

18. The method of claim 16, wherein a plurality of third recesses are formed in the second device region while forming the second recess, and the second recess is located between adjacent the plurality of third recesses.

* * * * *